United States Patent [19]
Yanagawa et al.

[11] Patent Number: 5,468,784
[45] Date of Patent: Nov. 21, 1995

[54] PHOTOPOLYMERIZABLE RESIN COMPOSITION

[75] Inventors: Makoto Yanagawa, Saitama; Hiroshi Yamamoto, Tokyo, both of Japan

[73] Assignee: Tamura Kaken Corporation, Japan

[21] Appl. No.: 200,727

[22] Filed: Feb. 23, 1994

[51] Int. Cl.$^6$ ............................ C08F 2/46; C03F 7/004
[52] U.S. Cl. .................. 522/31; 522/100; 522/103; 522/170; 522/904; 430/5; 430/271; 430/275; 430/280; 430/281; 525/531
[58] Field of Search ..................... 522/31, 100, 103, 522/170, 904; 430/5, 271, 275, 280, 281; 525/531

[56] References Cited

U.S. PATENT DOCUMENTS 4,798,877  1/1989  Hoffman et al. .................. 525/531
5,100,767  3/1992  Yanagawa et al. .................. 430/280

Primary Examiner—Mark A. Chapman
Attorney, Agent, or Firm—Wenderoth, Lind & Ponack

[57] ABSTRACT

Disclosed is a photopolymerizable resin composition suitable for forming a solder mask layer, for example, on a printed circuit board. The photopolymerizable resin composition of the invention can be prepared in the form of an aqueous solution and is developable with water as the developer liquid so that the problems and disadvantages inherent in the use of organic solvents can be completely solved. The composition comprises, in addition to a photopolymerization initiator and a polyenic compound as a reactive diluent, a unique prepolymer as a resinous ingredient which is a copolymer of, for example, an alkyl (meth)acrylate and glycidyl (meth)acrylate modified at the epoxy groups in the copolymer partly by the reaction with (meth)acrylic acid and partly by the reaction with an onium group-containing compound, e.g. a quaternary ammonium compound, to impart solubility in water.

6 Claims, No Drawings

PHOTOPOLYMERIZABLE RESIN COMPOSITION

BACKGROUND OF THE INVENTION

The present invention relates to a photopolymerizable resin composition or, more particularly, to a photopolymerizable resin composition suitable for patterning by the pattern-wise exposure to ultraviolet light and development with water and capable of giving a patterned layer having excellent adhesion to the substrate surface to serve satisfactorily as a solder mask on printed circuit boards.

A solder mask composition is a resin-based composition used for forming a protective layer of the resin over the whole surface of a printed circuit board and the like excepting the areas where various electronic devices are bonded by soldering in the manufacture of an electronic circuit unit on the printed circuit board. Namely, a solder mask serves to prevent deposition of the solder alloy on to the areas to be protected from contamination with the solder alloy in conducting mounting of electronic devices by soldering to the printed circuit board and also to protect the surface coated therewith from corrosion by the exposure to atmospheric oxygen and moisture.

A solder mask composition is applied pattern-wise to a printed circuit board usually by the method of screen printing and the masking layer is cured by the irradiation with ultraviolet light or by heating. Along with the trend in recent years toward a higher and higher density of the circuit pattern on printed circuit boards, masking layers are also required to be improved relative to the resolution and precision of patterning.

The method of screen printing as a patterning means of a solder mask layer has a limitation in respect of the resolution and fidelity of the pattern not to satisfy the above mentioned requirement for patterning of a solder mask layer in recent years. Accordingly, the method of screen printing is now under continuous replacement with a photolithographic patterning method by using a photopolymerizable resin composition which is superior to the screen printing method in respect of the precision in positioning and reliableness of coating along the edge lines of the conductive circuit lines. Various kinds of photopolymerizable resin compositions have been proposed for use as such a photolithographic solder mask composition including a liquid composition comprising a bisphenol-type epoxy acrylate, photosensitizer, epoxy compound, epoxy curing agent and organic solvent (see Japanese Patent Kokai No. 50-144431 and Japanese Patent Publication No. 51-40451).

A typical procedure for forming a patterned solder mask layer on a printed circuit board by using these photopolymerizable resin compositions is as follows. That is, a printed circuit board is coated all over the surface with the photopolymerizable resin composition in the form of a solution and the coating layer is dried by evaporating the organic solvent in the composition to form a masking layer which is exposed pattern-wise to light to form a latent image of the pattern followed by a development treatment by dissolving away the masking layer on the unexposed areas by using a liquid developer. The liquid developer conventionally used here is an organic solvent in most cases so that serious problems are unavoidable in this process due to the use of a large volume of an organic solvent as the liquid developer in addition to the problems due to the organic solvent contained in the liquid resin composition such as the danger of fire and adverse influences on the workers' health as well as environmental pollution. This is the reason for the strict restrictive regulation as a trend on the use of solution-type solder mask compositions.

In view of the above described problems, photopolymerizable resin compositions of another type suitable as a solder mask have been developed. Namely, photopolymerizable resin compositions, which can be developed with a dilute aqueous alkaline solution, have been developed including, for example, those comprising an alkali-soluble resin such as a reaction product of a novolac-type epoxy compound and an unsaturated monobasic carboxylic acid after a reaction with polybasic acid anhydride, a photopolymerization initiator, a diluent and an epoxy compound as is disclosed in Japanese Patent Publication No. 1-54390, those comprising a copolymer of a (meth)acrylic acid ester and (meth)acrylic acid modified by a (meth)acrylic acid ester having a terminal epoxy group by the addition reaction to a part of the carboxyl groups in the copolymer, a diluent and a photopolymerization initiator disclosed in Japanese Patent Kokai No. 3-172301, those comprising a novolac-type resin and an onium compound disclosed in Japanese Patent Kokai No. 60-175046 and No. 3-154059, and so on.

These prior art photopolymerizable resin compositions are imparted with developability by using an aqueous alkaline solution by the introduction of carboxyl groups into the photopolymerizable ingredient or by the use of an onium-type photopolymerizable ingredient. These photopolymerizable resin compositions, however, are still not free from the problems due to the use of an organic solvent because the resin composition must be in the form of a solution with an organic solvent in order to have an adequate viscosity suitable for application to the surface of a printed circuit board. In addition, a problem is unavoidable there in respect of disposal of the waste of the aqueous alkaline developer solution so that these alkali-developable masking compositions also must be under restriction when they are to be used in a large scale due to the problems to be solved.

SUMMARY OF THE INVENTION

The present invention accordingly has an object to overcome the above described problems and disadvantages in the conventional photolithographic solder mask compositions relative to the use of an organic solvent or an aqueous alkaline solution and to provide a novel and improved photopolymerizable resin composition which is not only developable with neutral water alone and capable of giving a patterned solder mask layer of high precision with high photopolymerizability but also capable of being prepared with water as the diluent.

Thus, the photopolymerizable resin composition of the present invention used in forming a patterned solder mask layer is a uniform blend in the form of a solution which comprises:

(a) a prepolymer which is a copolymer of a first monomer selected from the group consisting of alkyl esters of acrylic acid and methacrylic acid and a second monomer selected from the group consisting of acrylate esters and methacrylate esters having an epoxy group in a molecule in a molar ratio in the range from 40:60 to 80:20, the said copolymer being modified by the reaction of a part or, for example, from 20 to 80% of the epoxy groups therein with acrylic acid or methacrylic acid to introduce acryloyl groups or methacryloyl groups, respectively, and by the reaction of the remainder of the epoxy groups with an onium group-containing compound;

(b) a photopolymerization initiator; and (c) a reactive diluent which is a monomeric compound having at least two double bonds in a molecule.

DETAILED DESCRIPTION OF THE PREFERRED EMBODIMENTS

As is described above, the photopolymerizable resin composition of the present invention comprises, as the essential ingredients, the components (a), (b) and (c), of which the component (a) is a specific prepolymer photopolymerizable as promoted by the photopolymerization initiator as the component (b) and is crosslinked by the copolymerization with the reactive diluent as the component (c).

The prepolymer as the component (a) is a copolymer of an alkyl ester of (meth)acrylic acid as the first monomer and an epoxy-containing (meth)acrylate ester such as glycidyl (meth)acrylate and 3,4-epoxycyclohexylmethyl (meth)acrylate as the second monomer after modification to introduce (meth)acryloyl groups and onium groups. The alkyl ester of (meth)acrylic acid as the first monomer is represented by the general formula

$$CH_2=CR^1-CO-O-R^2, \qquad (I)$$

in which $R^1$ is a hydrogen atom or a methyl group and $R^2$ is an alkyl group, preferably, having 1 to 4 carbon atoms. Examples of suitable alkyl (meth)acrylate include methyl methacrylate, ethyl methacrylate, butyl methacrylate and the like. The first monomer can be a single kind of these alkyl (meth)acrylates or can be a combination of two kinds or more thereof according to need.

The second monomer to be copolymerized with the above defined alkyl (meth)acrylate as the first monomer is an epoxy-containing (meth)acrylate ester compound represented by the general formula

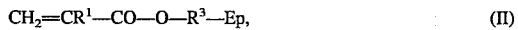

$$CH_2=CR^1-CO-O-R^3-Ep, \qquad (II)$$

in which $R^1$ has the same meaning as defined above, $R^3$ is an aliphatic or aromatic divalent hydrocarbon group and Ep is an epoxy group. The group —$R^3$—Ep can be a 3,4-epoxycyclohexylalkyl group. Examples of the epoxy-containing (meth)acrylate ester compound as the second monomer include: glycidyl acrylate, glycidyl methacrylate, glycidylmethyl acrylate, glycidylmethyl methacrylate, 4-epoxybenzyl acrylate, 4-epoxybenzyl methacrylate and the like. These epoxy-containing (meth)acrylate ester compounds can be used either singly or as a combination of two kinds or more according to need as the second monomer.

The copolymer of the above described first and second monomers is prepared by conducting copolymerization in a mixture of these monomers in the presence of a free-radical polymerization initiator such as organic peroxides and azo compounds according to a known procedure. The molar proportion of the first monomer represented by the general formula (I) and the second monomer represented by the general formula (II) is preferably in the range from 40:60 to 80:20. When the amount of the second monomer having an epoxy group in a molecule is too small, the content of epoxy groups in the copolymer is naturally so low that the amount of the (meth)acryloyl groups introduced into the copolymer cannot be large enough and the prepolymer as the component (a) is poor in the photopolymerizability by the irradiation with ultraviolet light. When the molar proportion of the epoxy-containing second monomer is too large, on the other hand, a decrease is caused in the softening point of the patterned solder mask layer obtained by curing the photopolymerizable resin composition and the tackiness of the surface of the solder mask layer would be increased.

The copolymer prepared in the above described manner is then reacted with acrylic acid or methacrylic acid so that an addition reaction takes place between a part of the epoxy groups in the copolymer molecules and the carboxyl groups in the (meth)acrylic acid so as to introduce acryloyl or methacryloyl groups into the copolymer. It is preferable in this modification reaction of the copolymer that from 20 to 80% of the epoxy groups in the copolymer are reacted with (meth)acrylic acid so as to leave a substantial amount of the epoxy groups unreacted. When the amount of the (meth)acrylic acid to be reacted with the epoxy groups in the copolymer is too small, the content of ethylenically unsaturated linkages introduced into the copolymer cannot be high enough so that the modified copolymer as the prepolymer has unduly low photopolymerizability by the ultraviolet irradiation. When the amount of the reacted (meth)acrylic acid is too large, on the other hand, the amount of the unreacted epoxy groups left in the copolymer is too small as a matter of course so that the amount of the onium-containing groups to be introduced by the reaction of an onium compound with the epoxy groups cannot be large enough and the prepolymer would have insufficient solubility in water not to achieve the object of the invention.

As is mentioned above, the epoxy groups in the copolymer left unreacted in the above mentioned reaction with (meth)acrylic acid are then reacted with an onium group-containing compound to introduce the onium-containing groups into the copolymer. The onium compound used to introduce onium-containing groups into the copolymer is exemplified by sulfonium compounds represented by the general formula $[R_3S^+]X^-$, in which R is an alkyl group or an aryl group and $X^-$ is an anion, such as triphenyl sulfonium salts, tributyl sulfonium salts and the like, aryl iodonium compounds represented by the general formula $[Ar_2I^+]X^-$, in which Ar is an aryl group and $X^-$ is an anion, such as diphenyl iodonium chloride, diphenyl iodonium hexafluorophosphate and the like, phosphonium compounds represented by the general formula $[R_4P^+]X^-$, in which each symbol has the same meaning as defined above, such as tetramethyl phosphonium iodide, tetraethyl phosphonium bromide and the like, and quaternary ammonium compounds represented by the general formula $[R_4N^+]X^-$, in which each symbol has the same meaning as defined above, such as tetramethyl ammonium chloride, tetraethyl ammonium bromide and the like.

The copolymer of the first and the second monomers after introduction of the (meth)acryloyl groups by the reaction of a part of the epoxy groups with (meth)acrylic acid is then reacted with the above described onium compound so that the onium-containing groups are introduced into the copolymer by the reaction with the remaining epoxy groups in the copolymer to give the prepolymer used as the component (a) in the inventive composition. The modification reaction should be as complete as possible so as not to leave unreacted epoxy groups in the copolymer. It is an alternative way that the copolymer having unreacted epoxy groups after the reaction with (meth)acrylic acid is reacted with a compound capable of forming an onium groups, such as trialkyl phosphines, tertiary amines, alkyl sulfides and the like, in the presence of a compound to serve as an anion source, such as halides, organic acids and the like. Examples of the organic acid suitable for the purpose include formic acid, acetic acid, acrylic acid, methacrylic acid, lactic acid, crotonic acid, maleic acid, fumaric acid, itaconic acid and the like. The prepolymer as the component (a) should have an average molecular weight, preferably, in the range from 20,000 to 70,000.

The component (b) as one of the essential ingredients in the inventive photopolymerizable resin composition is a photopolymerization initiator which is exemplified by benzoin, benzoin methyl ether, benzoin ethyl ether, benzoin propyl ether, benzoin n-butyl ether, benzoin isobutyl ether, acetophenone, dimethylamino acetophenone, 2,2-dimethoxy-2-phenyl acetophenone, 2,2-diethoxy-2-phenyl acetophenone, 2-hydroxy-2-methyl-1-phenyl propan-1-one, 1-hydroxycyclohexyl phenyl ketone, 2-methyl-1-[4-(methylthio)phenyl]-2-morpholino propan-1-one, 4-(2-hydroxyethoxy)phenyl-(2-hydroxypropyl-2) ketone, benzophenone, p-phenyl benzophenone, 4,4'-diethylamino benzophenone, dichlorobenzophenone, 2-methyl anthraquinone, 2-ethyl anthraquinone, 2-tert-butyl anthraquinone, 2-amino anthraquinone, 2-methyl thioxanthone, 2-ethyl thioxanthone, 2-chloro thioxanthone, 2,4-dimethyl thioxanthone, 2,4-diethyl thioxanthone, benzyl dimethyl ketal, acetophenone dimethyl ketal, ethyl 4-dimethylamino benzoate and the like. These compounds can be used either singly or as a combination of two kinds or more according to need. The amount of the photopolymerization initiator in the inventive photopolymerizable resin composition is in the range from 0.5 to 50 parts by weight or, preferably, from 2 to 30 parts by weight per 100 parts by weight of the prepolymer as the component (a).

The third of the essential ingredients in the inventive photopolymerizable resin composition, i.e. component (c), is a reactive diluent which serves to ensure complete curing of the prepolymer as the component (a) by crosslinking so as to impart the cured solder mask layer with further improved resistance against acids and alkalis as well as heat resistance. The reactive diluent is preferably a monomeric compound having at least two ethylenically unsaturated linkages in a molecule. Examples of such an unsaturated compound include 1,4-butanediol di(meth)acrylate, 1,6-hexanediol di(meth)acrylate, neopentylglycol di(meth)acrylate, polyethyleneglycol di(meth)acrylate, neopentylglycol adipate di(meth)acrylate, neopentylglycol di(meth)acrylate hydroxypivalate, dicyclopentadienyl di(meth)acrylate, caprolactone-modified dicyclopentenyl di(meth)acrylate, ethylene oxide-modified phosphoric acid di(meth)acrylate, allylated cyclohexyl di(meth)acrylate, isocyanurate di(meth)acrylate, trimethylol propane tri(meth)acrylate, dipentaerithritol tri(meth)acrylate, propionic acid-modified dipentaerithritol tri(meth)acrylate, pentaerithritol tri-(meth)acrylate, propylene oxide-modified trimethylol propane tri(meth)acrylate, tris(acryloxyethyl) isocyanurate, propionic acid-modified dipentaerithritol penta(meth)acrylate, dipentaerithritol hexa(meth)acrylate, caprolactone-modified dipentaerithritol hexa(meth)acrylate and the like. These polyenic compounds having 2 to 6 ethylenically unsaturated linkages in a molecule as the reactive diluent can be used either singly or as a combination of two kinds or more according to need. The amount of the reactive diluent as the component (c) in the inventive photopolymerizable resin composition is in the range from 2 to 40 parts by weight or, preferably, from 4 to 20 parts by weight per 100 parts by weight of the prepolymer as the component (a). When the amount of the reactive diluent is too small in the polymerizable composition, curing of the masking layer by the irradiation with light is incomplete so that a decrease is caused in the acid resistance and heat resistance of the cured solder mask layer. When the amount of the reactive diluent is too large, on the other hand, the solder mask layer before curing may have unduly high tackiness eventually to cause troubles due to sticking between the masking layer and the artwork transparency mounted on the substrate surface in the course of the pattern-wise exposure of the masking layer to ultraviolet light.

The photopolymerizable resin composition of the present invention can be prepared by uniformly blending the above described essential ingredients including the prepolymer as the component (a), photopolymerization initiator as the component (b) and reactive diluent as the component (c) in specified proportions. It is of course optional that the composition contains various kinds of other ingredients including the organic solvent or water used in the synthetic preparation of the prepolymer as well as other known additives exemplified by inorganic fillers or pigments such as finely divided silica fillers, alumina, talc, calcium carbonate, barium sulfate and the like, organic pigments such as phthalocyanine-based pigments and azo pigments, known additives in conventional coating compositions such as defoaming agents and levelling agents, curing accelerators such as urea compounds, imidazol compounds and the like, and so on each in a limited amount. It is further optional that the inventive photopolymerizable resin composition is admixed with a thermosetting resin such as epoxy resins, phenolic resins and the like with an object to improve the heat resistance of the patterned solder mask layer of the composition after curing.

In the following, the photopolymerizable resin composition of the present invention is described in more detail by way of examples. The photopolymerizable resin composition prepared in each of the following examples was tested and evaluated for the items given below by the respective testing procedures described there.

(1) Developability

A substrate plate (IPC Multi-Purpose Test Board, IPC-B-25) was uniformly coated with the photopolymerizable resin composition under testing to form a masking layer having a thickness of 20 to 25 µm as dried, which was exposed pattern-wise to ultraviolet light having a peak wavelength of 365 nm in a dose of 1000 mJ/cm$^2$ through an artwork transparency to form a latent image. The masking layer after pattern-wise exposure to ultraviolet light was developed by spraying city water at a pressure of 0.7 kgf/cm$^2$G for 60 seconds to dissolve away the resin composition on the unexposed areas of the masking layer. After drying, the thus developed masking layer was visually inspected to examine the state of the remaining patterned masking layer on the unexposed areas to record the results in four ratings of A, B, C and D, of which A was for complete removal of the masking layer, B was for a slightly incomplete removal of the masking layer leaving a very thin film, C was for incomplete development with eventual crack formation or swelling of the masking layer in a part and D was for failure of development or crack formation or swelling on all over the masking layer.

(2) Adhesion

A masking layer having a thickness of 20 to 25 µm was formed by light-exposure and development on a substrate plate in the same manner as above and, according to the testing procedure specified in JIS D 0202, the masking layer was incised down and across in a checkerboard-like crossing to form 100 isolated sections of each 1 mm by 1 mm square. A cellophane-based pressure-sensitive adhesive tape was applied and bonded by pressing to the thus cross-cut masking layer and then peeled off to count the number of the square sections removed by adhering to the adhesive tape.

The results were recorded in four ratings of A, B, C and D, of which A was for complete intactness of the masking layer, B was for absence of removed sections but with partial peeling of the layer along the cross-cut lines, C was for the removal of 10 to 50 sections and D was for the removal of 50 or more of the sections.

(3) Pencil hardness

Testing was performed for the test specimens, which was prepared in the same manner as described above and further subjected to a post-curing treatment by heating at 150° C. for 30 minutes, according to the procedure specified in JIS K 5400.

(4) Heat resistance against molten solder alloy

The test specimen after the post-curing treatment prepared in the same manner as described above was put on the surface of a bath of a molten solder alloy kept at 260° C. to float thereon with the masking layer in contact with the molten solder alloy for 10 seconds and then taken up therefrom. This contacting procedure was repeated three times with a few seconds intervals between contactings and the state of the masking layer was visually inspected to record the results in four ratings of A, B, C and D, of which A was for the complete absence of any visually noticeable changes, B was for a noticeable, though very slight, change in the appearance, C was for partial lifting of the masking layer from the substrate surface and D was for exfoliation of the masking layer all over the substrate surface.

(5) Electric properties: insulation and stability

Test specimens after the post-curing treatment prepared in the same manner as described above were kept in an atmosphere controlled at a temperature of 60° C. with a relative humidity of 90% under application of a direct-current voltage of 50 volts between two comb-type electrodes specified in IPC-SM-840B, B-25 test coupon, and the surface resistivity of the masking layer was measured after 240 hours along with visual inspection of the state of the masking layer to record the results in four ratings of A, B, C and D, of which A was for absolute absence of discoloration of the masking layer, B was for slight discoloration, C was for clearly noticeable discoloration and D was for scorching with black discoloration.

Preparation of prepolymer I.

Into a four-necked flask were introduced 100 parts by weight of methyl methacrylate, 616 parts by weight of ethyl methacrylate, 284 parts by weight of glycidyl methacrylate, 30 parts by weight of azobisisobutyronitrile and 500 parts by weight of n-butyl alcohol to form a polymerization mixture, which was heated at 60° C. for 10 hours under an atmosphere of nitrogen gas to effect solution copolymerization of the monomers. After completion of the copolymerization reaction, the polymer solution in the flask was admixed with 72 parts by weight of acrylic acid, 0.5 part by weight of hydroquinone and 1 part by weight of tetramethylammonium chloride and heated at 110° for 2.5 hours to effect the modification reaction until the acid value of the reaction mixture was substantially equal to zero. Thereafter, the reaction mixture was further admixed with 60 parts by weight of acetic acid and 89 parts by weight of 2-dimethylaminoethyl alcohol and heated at 70° C. for 4 hours to effect a further modification reaction. The thus obtained resin solution was freed from n-butyl alcohol as the solvent by heating under reduced pressure to give a modified copolymer, which is referred to as the prepolymer I hereinbelow, having an average molecular weight of about 35,000 and a softening point of 75° C. This prepolymer I was dissolved in 667 parts by weight of water to give an aqueous resin solution having a solid content of 65% by weight.

Preparation of prepolymer II.

The procedure for the preparation of a 65% aqueous solution of a second prepolymer, which is referred to as the prepolymer II hereinbelow, was substantially the same as in the preparation of the aqueous solution of the prepolymer I described above excepting for the replacement of 89 parts by weight of 2-dimethylaminoethyl alcohol with 76 parts by weight of trimethyl phosphine.

Preparation of prepolymer III.

The procedure for the preparation of a 65% aqueous solution of a third prepolymer, which is referred to as the prepolymer III hereinbelow, was substantially the same as in the preparation of the aqueous solution of the prepolymer I described above excepting for the replacement of 89 parts by weight of 2-dimethylaminoethyl alcohol with 62 parts by weight of dimethyl sulfide.

Preparation of prepolymer IV.

Into a four-necked flask were introduced 100 parts by weight of methyl methacrylate, 616 parts by weight of ethyl methacrylate, 284 parts by weight of glycidyl methacrylate, 30 parts by weight of azobisisobutyronitrile and 500 parts by weight of n-butyl alcohol to form a polymerization mixture, which was heated at 60° C. for 10 hours under an atmosphere of nitrogen gas to effect solution copolymerization of the monomers. After completion of the copolymerization reaction, the polymer solution in the flask was admixed with 129.6 parts by weight of acrylic acid, 0.5 part by weight of hydroquinone and 1 part by weight of tetramethylammonium chloride and heated at 110° C. for 2.5 hours to effect the modification reaction until the acid value of the reaction mixture was substantially equal to zero. Thereafter, the reaction mixture was further admixed with 12 parts by weight of acetic acid and 17.8 parts by weight of 2-dimethylaminoethyl alcohol and heated at 70° C. for 4 hours to effect a further modification reaction. The thus obtained resin solution was freed from n-butyl alcohol as the solvent by heating under reduced pressure to give a modified copolymer, which is referred to as the prepolymer IV hereinbelow. This prepolymer IV was dissolved in 641 parts by weight of water to give an aqueous resin solution having a solid content of 65% by weight.

Preparation of prepolymer V.

The procedure for the preparation of a 65% aqueous solution of a fifth prepolymer, which is referred to as the prepolymer V hereinbelow, was substantially the same as in the preparation of the aqueous solution of the prepolymer IV described above except that the amount of the acrylic acid was 14.4 parts by weight instead of 129.6 parts by weight, amount of the acetic acid was 108 parts by weight instead of 12 parts by weight, amount of the 2-dimethylaminoethyl alcohol was 160.2 parts by weight instead of 17.8 parts by weight and amount of the water was 707 parts by weight instead of 641 parts by weight.

EXAMPLE 1

A photopolymerizable resin composition was prepared by mixing 100 parts by weight of the 65% aqueous solution of the prepolymer I prepared above with 8.0 parts by weight of 4-(2-hydroxyethoxy)phenyl-(2-hydroxypropyl-2) ketone (Dalcure 2959, a product by Merck Japan Co.), 0.5 part by weight of phthalocyanine green, 8.0 parts by weight of polyethyleneglycol diacrylate (A-200, a product by Shin-Nakamura Kagaku Co.), 8.0 parts by weight of triglycidyl tris(2-hydroxyethyl) isocyanurate (Denacor EX-301, a product by Nagase Kasei Kogyo Co.) and 8.0 parts by weight of talc and milling of the mixture on a three-roller mill.

A substrate plate for a printed circuit board having a patterned copper foil layer formed in advance was coated with this photopolymerizable resin composition in a coating thickness of 40 to 50 μm as dried by the method of screen printing followed by drying in a hot-air circulation oven at 40° C. for 20 minutes. The thus formed resin layer on the substrate was exposed pattern-wise to ultraviolet light in a dose of 1000 mJ/cm$^2$ through a test board (IPC Multi-Purpose Test Board IPC-B-25 specified in IPC-TM-650, No. 5.8.6) and then developed by spraying of city water taking 60 seconds followed by post-curing at 150° C. for 30 minutes in a hot-air circulation oven to give a patterned solder mask layer.

The results of the evaluation tests of this patterned solder mask layer undertaken in the above described manner were that the developability, adhesion and heat resistance against molten solder were rated all in A and the stability in voltage application was rated in B with a pencil hardness of 5H and electric insulating resistivity of $3.0 \times 10^{11}$ ohm.

EXAMPLE 2

The experimental procedure was substantially the same as in Example 1 excepting replacement of the 65% aqueous solution of the prepolymer I with the same amount of the 65% aqueous solution of the prepolymer II. The results of the evaluation tests of the patterned solder mask layer were as good as in Example 1 for each of the items. The electric insulating resistivity was $1.4 \times 10^{11}$ ohm.

EXAMPLE 3

The experimental procedure was substantially the same as in Example 1 excepting replacement of the 65% aqueous solution of the prepolymer I with the same amount of the 65% aqueous solution of the prepolymer III. The results of the evaluation tests of the patterned solder mask layer were as good as in Example 1 for each of the items. The electric insulating resistivity was $2.0 \times 10^{11}$ ohm.

Comparative Example 1.

The experimental procedure was substantially the same as in Example 1 excepting replacement of the 65% aqueous solution of the prepolymer I with the same amount of the 65% aqueous solution of the prepolymer IV. The results of the evaluation tests of the patterned solder mask layer were that the developability was rated in D, adhesion and heat resistance against molten solder were rated each in A and the stability in voltage application was rated in B with a pencil hardness of 5H and electric insulating resistivity of $3.5 \times 10^{11}$ ohm.

Comparative Example 2

The experimental procedure was substantially the same as in Example 1 excepting replacement of the 65% aqueous solution of the prepolymer I with the same amount of the 65% aqueous solution of the prepolymer V. The results of the evaluation tests of the patterned solder mask layer were that the developability was rated in B, adhesion and heat resistance against molten solder were rated each in D and the stability in voltage application was rated in C with a pencil hardness of 3H and electric insulating resistivity of $1.0 \times 10^{11}$ ohm.

What is claimed is:

1. A photopolymerizable resin composition which comprises, as a uniform blend:

(a) a prepolymer having an average molecular weight of from 20,000 to 70,000, which is a copolymer of a first monomer selected from the group consisting of alkyl esters of acrylic acid and methacrylic acid and a second monomer selected from the group consisting of acrylate acid esters and methacrylic esters having an epoxy group in a molecule, the said copolymer being modified by the reaction of from 20% to 80% of the epoxy groups therein with acrylic acid or methacrylic acid to introduce acryloyl groups or methacryloyl groups, respectively, and by the reaction of the remainder of the epoxy groups with an onium group-containing compound;

(b) a photopolymerization initiator; and (c) a reactive diluent having at least two ethylenically unsaturated linkages per molecule.

2. The photopolymerizable resin composition as claimed in claim 1 in which the copolymer is a copolymer of the first and the second monomers in a molar ratio in the range from 40:60 to 80:20.

3. The photopolymerizable resin composition as claimed in claim 1 in which the amount of the photopolymerization initiator as the component (b) is in the range from 0.5 to 50 parts by weight per 100 parts by weight of the prepolymer as the component (a).

4. The photopolymerizable resin composition as claimed in claim 1 in which the amount of the reactive diluent as the component (c) is in the range from 2 to 40 parts by weight per 100 parts by weight of the prepolymer as the component (a).

5. The photopolymerizable resin composition as claimed in claim 1 in which the second monomer is glycidyl acrylate or glycidyl methacrylate.

6. The photosensitive resin composition as claimed in claim 1 in which the onium group-containing compound is selected from the group consisting of sulfonium compounds, aryl iodonium salts, phosphonium compounds and quaternary ammonium compounds.

\* \* \* \* \*